United States Patent
Sprentall et al.

(10) Patent No.: US 11,626,228 B2
(45) Date of Patent: Apr. 11, 2023

(54) MULTI-LAYER MAGNETO-DIELECTRIC MATERIAL

(71) Applicant: Rogers Corporation, Chandler, AZ (US)

(72) Inventors: Karl E. Sprentall, Scottsdale, AZ (US); Aniruddha J. Shere, Chelmsford, MA (US); Yajie Chen, Brighton, MA (US); Murali Sethumadhavan, Acton, MA (US)

(73) Assignee: ROGERS CORPORATION, Chandler, AZ (US)

( * ) Notice: Subject to any disclaimer, the term of this patent is extended or adjusted under 35 U.S.C. 154(b) by 925 days.

(21) Appl. No.: 15/850,466

(22) Filed: Dec. 21, 2017

(65) Prior Publication Data

US 2018/0182525 A1  Jun. 28, 2018

Related U.S. Application Data

(60) Provisional application No. 62/437,807, filed on Dec. 22, 2016.

(51) Int. Cl.
*H01F 10/26* (2006.01)
*H01F 10/14* (2006.01)
(Continued)

(52) U.S. Cl.
CPC ............ *H01F 10/265* (2013.01); *H01F 10/14* (2013.01); *H01F 10/30* (2013.01); *H01Q 1/38* (2013.01);
(Continued)

(58) Field of Classification Search
CPC ......... H01F 10/265; H01F 10/30; H01Q 1/38; H05K 2201/0195
See application file for complete search history.

(56) References Cited

U.S. PATENT DOCUMENTS

| | | | |
|---|---|---|---|
| 3,376,520 | A | 4/1968 | Flannery |
| 3,540,047 | A | 11/1970 | Walser et al. |

(Continued)

FOREIGN PATENT DOCUMENTS

| | | |
|---|---|---|
| WO | 2011068695 A1 | 6/2011 |
| WO | 2015047672 A1 | 4/2015 |

OTHER PUBLICATIONS

International Search Report; International Application No. PCT/US2017/068082, which is related to U.S. Appl. No. 15/850,466; dated May 23, 2018; Report Received Date: Jun. 1, 2018; 6 pages.

(Continued)

*Primary Examiner* — Laura A Auer
(74) *Attorney, Agent, or Firm* — Cantor Colburn LLP

(57) ABSTRACT

A magneto-dielectric material operable between a minimum frequency and a maximum frequency, having: a plurality of layers that alternate between a dielectric material and a ferromagnetic material, lowermost and uppermost layers of the plurality of layers each being a dielectric material; each layer of the plurality of ferromagnetic material layers having a thickness equal to or greater than $\frac{1}{15}^{th}$ a skin depth of the respective ferromagnetic material at the maximum frequency, and equal to or less than $\frac{1}{5}^{th}$ the skin depth of the respective ferromagnetic material at the maximum frequency; each layer of the plurality of dielectric material layers having a thickness and a dielectric constant that provides a dielectric withstand voltage across the respective thickness of equal to or greater than 150 Volts peak and equal to or less than 1,500 Volts peak; and, the plurality of layers having an overall thickness equal to or less than one wavelength of the minimum frequency in the plurality of layers.

19 Claims, 2 Drawing Sheets

(51) Int. Cl.
  *H01F 10/30* (2006.01)
  *H01Q 9/04* (2006.01)
  *H05K 1/03* (2006.01)
  *H01Q 1/38* (2006.01)

(52) U.S. Cl.
  CPC ......... *H01Q 9/0407* (2013.01); *H05K 1/0373* (2013.01); *H05K 2201/0195* (2013.01); *H05K 2201/086* (2013.01)

(56) References Cited

U.S. PATENT DOCUMENTS

| | | |
|---|---|---|
| 4,778,557 A | 10/1988 | Schirmer |
| 5,925,455 A | 7/1999 | Bruzzone et al. |
| 6,421,303 B1 | 7/2002 | Inoue et al. |
| 7,362,195 B2 | 4/2008 | Chui |
| 7,619,042 B2 | 11/2009 | Poe et al. |
| 2003/0030994 A1 | 2/2003 | Takaya et al. |
| 2004/0219328 A1 | 11/2004 | Tasaki et al. |
| 2010/0015179 A1 | 1/2010 | Frolov et al. |
| 2012/0236528 A1 | 9/2012 | Le et al. |
| 2018/0096771 A1* | 4/2018 | Deligianni ............ H01F 17/04 |
| 2018/0218836 A1 | 8/2018 | Kim et al. |
| 2018/0240474 A1* | 8/2018 | Burnett .................. B32B 15/20 |

OTHER PUBLICATIONS

Janghoon et al., "Roll-to-Roll Coating Technology and Its Applications: A Review," International Journal of Precision Engineering and Manufacturing, Apr. 2016, pp. 537-550, vol. 17, No. 4.
Written Opinion; International Application No. PCT/US2017/068082, which is related to U.S. Appl. No. 15/850,466; dated May 23, 2018; Report Received Date: Jun. 1, 2018; 10 pages.

* cited by examiner

MULTI-LAYER MAGNETO-DIELECTRIC MATERIAL

CROSS REFERENCE TO RELATED APPLICATIONS

This application claims the benefit of U.S. Provisional Application Ser. No. 62/437,807, filed Dec. 22, 2016, which is incorporated herein by reference in its entirety.

BACKGROUND

The present disclosure relates generally to a magneto-dielectric material, particularly to a multi-layer magneto-dielectric material, and more particularly to a multi-layer magneto-dielectric thin film material.

Multi-layer dielectric-magnetic structures have the benefit of exploiting shape anisotropy to produce higher ferromagnetic resonance frequencies, and exploiting favorable mix rules for dielectric and magnetic materials to produce a structured arrangement having a low z-axis permittivity and high x-y plane permeability, which is ideal for patch derived antenna structures. However, existing structured arrangements in the form of laminates unfavorably suffer from high magnetic loss, high dielectric loss, and/or low permeability due to a high ratio of dielectric to magnetic material volumes.

While prior publications have disclosed the concept of reducing the thickness of the dielectric insulating material as a method of increasing impedance (the square root of the ratio of effective permeability to permittivity), these publications have lacked the information to enable the reduction of this concept to practice. Specifically, the need to maintain the integrity of the dielectric layer during the high temperature deposition of the ferromagnetic material has not been addressed in sufficient detail to enable the reduction to practice of these structures with thin dielectric materials.

A second limitation, which has not been addressed, is the need for an antenna material that can withstand transient voltages seen by an antenna substrate. In a practical application, transient voltages caused by a mismatch between the antenna and a power source, rapid changes in current, or electrostatic discharge, can cause the degradation of the insulating layer between the ferromagnetic materials. This degradation can lead to two primary failure modes. In a first failure mode in the event of a dielectric breakdown, where the ferromagnetic layer is sufficiently thick (greater than $1/10^{th}$ the polymer/dielectric layer thickness), a shorting between ferromagnetic layers can occur in the event of a dielectric failure. This shorting between layers can result in a shift of the effective permeability or permittivity, changing the resonant frequency of an antenna, reducing the radiation efficiency, and/or further degrading the match between the antenna and the power source, leading to an unstable antenna substrate, whose properties continue to degrade with time. In a second failure mode, when the ratio between polymer thickness to metal thickness is sufficiently high (approximately greater than 10:1) typically no shorting between the ferromagnetic layers will occur. In these two types of failure modes, the dielectric constant of the multi-layer structure will shift, resulting in a corresponding shift in antenna resonant frequency.

While existing multi-layer magneto-dielectric materials may be suitable for their intended purpose, the art relating to multi-layer magneto-dielectric materials would be advanced with a multi-layer magneto-dielectric material that overcomes at least some of the unfavorable limitations of existing laminates.

This background information is provided to reveal information believed by the Applicant to be of possible relevance to the present disclosure. No admission is necessarily intended, nor should be construed, that any of the preceding information constitutes prior art against the present disclosure.

BRIEF SUMMARY

Disclosed herein is a method of forming a magneto-dielectric material and the magneto-dielectric material made therefrom.

An embodiment includes a magneto-dielectric material operable over an operating frequency range equal to or greater than a defined minimum frequency and equal to or less than a defined maximum frequency, the magneto-dielectric material having: a plurality of layers in conforming direct contact with respective adjacent layers that alternate between a dielectric material and a ferromagnetic material forming a plurality of dielectric material layers in alternating arrangement with a plurality of ferromagnetic material layers, a lowermost layer and an uppermost layer of the plurality of layers each being a dielectric material; each layer of the plurality of ferromagnetic material layers having a thickness equal to or greater than $1/15^{th}$ a skin depth of the respective ferromagnetic material at the defined maximum frequency, and equal to or less than $1/5^{th}$ the skin depth of the respective ferromagnetic material at the defined maximum frequency; each layer of the plurality of dielectric material layers having a thickness and a dielectric constant that provides a dielectric withstand voltage across the respective thickness of equal to or greater than 150 Volts peak and equal to or less than 1,500 Volts peak; and, the plurality of layers having an overall thickness equal to or less than one wavelength of the defined minimum frequency in the plurality of layers.

The above described and other features are exemplified by the following figures and detailed description.

BRIEF DESCRIPTION OF THE DRAWINGS

Refer now to the figures, which are exemplary embodiments, and wherein the like elements are numbered alike.

DETAILED DESCRIPTION

Although the following detailed description contains many specifics for the purpose of illustration, anyone of ordinary skill in the art will appreciate that many variations and alterations to the following details are within the scope of the invention. Accordingly, the following example embodiments are set forth without any loss of generality to, and without imposing limitations upon, the claimed invention.

An embodiment, as shown and described by the various figures and accompanying text, provides a magneto-dielectric material or cavity loading material having multiple layers of ferromagnetic material alternatingly sandwiched between layers of a low loss dielectric material.

Figure 1:
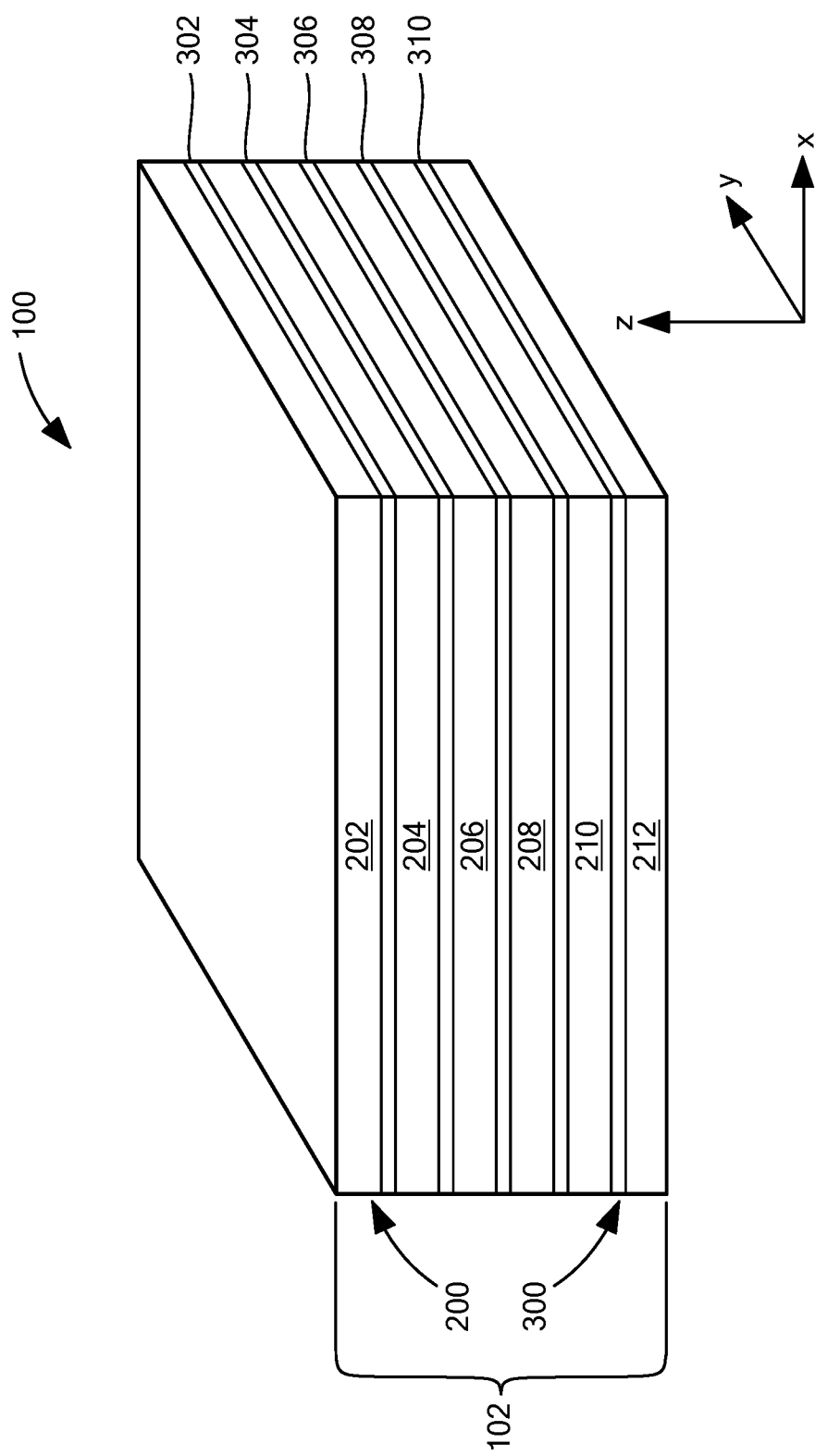
FIG. 1 depicts an illustrative perspective view of an embodiment of a magneto-dielectric material, in accordance with an embodiment.

For example, FIG. 1 illustrates that the magneto-dielectric material 100 includes a plurality of layers 102 in conforming direct contact with respective adjacent layers that alternate between dielectric material 200 and ferromagnetic material 300 forming a plurality of dielectric material layers 202, 204, 206, 208, 210, 212 (collectively herein referred to by reference numeral 200) in alternating arrangement with a plurality of ferromagnetic material layers 302, 304, 306, 308, 310 (collectively herein referred to by reference numeral 300). The outermost layers of the plurality of layers are dielectric material layers 212 and 202 of the dielectric material 200. The plurality of layers 102 is arranged parallel with an x-y plane in an orthogonal x-y-z coordinate system, and the overall thickness of the plurality of layers 102 is in the z-direction. The plurality of dielectric material layers can occupy 0.1 to 99 volume percent (vol %), or 0.1 to 50 vol %, or 50 to 90 vol %, or 90 to 99 vol %, or 5 to 55 vol % of the total volume of the plurality of layers.

While the magneto-dielectric material 100 of FIG. 1 depicts individual ones of the plurality of layers 102 having certain visual dimensions with respect to itself and in relation to another layer, it will be appreciated that this is for illustration purposes only and is not intended to limit the scope of the disclosure disclosed herein, and the scale of the plurality of layers 102 is depicted in an exaggerated manner. While only five layers of ferromagnetic material layers 302-310 are described herein and depicted in FIG. 1, it will be appreciated that the scope of the disclosure is not so limited and encompasses any number of layers, more or less than five, suitable for a purpose disclosed herein and falling within the ambit of the claims provided herewith. Likewise, while only six layers of dielectric material layers 202-212 are described herein and depicted in FIG. 1, it will be appreciated that the scope of the disclosure is not so limited and encompasses any number of layers, more or less than six, suitable for a purpose disclosed herein and falling within the ambit of the claims provided herewith. For example, the total number of layers 102 can be 19 to 10,001. Any range of layers between 19 and 10,001 layers is contemplated without the unnecessary listing of each and every range contemplated.

The magneto-dielectric material 100 can be operable over an operating frequency range greater than or equal to a defined minimum frequency and less than or equal to a defined maximum frequency. The defined minimum frequency can be given by, (defined minimum frequency)= (defined maximum frequency)/25. The defined maximum frequency can be 7 gigahertz (GHz). The operating frequency range can be 100 megahertz (MHz) to 10 GHz, or 1 to 10 GHz, or 100 MHz to 5 GHz.

The plurality of layers 102 can have an overall thickness of less than or equal to one wavelength of the defined minimum frequency that propagates in the plurality of layers 102. The wavelength in the plurality of layers 102 is given by:

$$\lambda = c/[f^* \text{sqrt}(\varepsilon_0^* \varepsilon_r^* \mu_0^* \mu_r)];$$

where: c is the speed of light in a vacuum in meters/second; f is the defined minimum frequency in Hertz; $\varepsilon_0$ is the permittivity of a vacuum in Farads/meter; $\varepsilon_r$ is the relative permittivity of the plurality of layers in the z-direction; $\mu_0$ is the permeability of a vacuum in Henrys/meter; and $\mu_r$ is the relative permeability of the plurality of layers in the x-y plane. As can be seen with reference to FIG. 1, the layered magneto-dielectric material 100 has a permittivity that is anisotropic and dominated by the dielectric material in the Z-axis direction. In an embodiment, the effective dielectric constant (relative permittivity) of the magneto-dielectric material 100 in the Z-axis direction is equal to or greater than 2.5 and equal to or less than 5.0.

The plurality of layers 102 has an overall electric loss tangent (tan $\delta_e$), an overall magnetic loss tangent (tan $\delta_m$), and an overall quality factor (Q) defined by $(1/((\tan \delta_e)+(\tan \delta_m)))$, wherein the defined maximum frequency is defined by a frequency at which Q equals 20, or more specifically falls below 20. The overall quality factor Q can be determined according to a standardized Nicolson-Roth-Weir (NRW) method, see NIST (National Institute of Standards and Technology) Technical Note 1536, "Measuring the Permittivity and Permeability of Lossy Materials: Solids, Liquids, Metals, Building Materials, and Negative-Index Materials", James Baker Jarvis et. al., February 2005, CODEN: NTNOEF, pp 66-74, for example. The NRW method provides calculations for $\varepsilon'$ and $\varepsilon''$ (complex relative permittivity components), and for $\mu'$ and $\mu''$ (complex relative permeability components). The loss tangents $\mu''/\mu'$ (tan $\delta_m$) and $\varepsilon''/\varepsilon'$ (tan $\delta_e$) can be calculated from those results. The quality factor Q is the inverse of the sum of the loss tangents. The overall thickness of the plurality of layers 102 can be 0.1 to 3 millimeters. In an embodiment, a permeameter was used to measure the electromagnetic permeability of samples of the plurality of layers 102.

In an embodiment, the magneto-dielectric material 100 is operable at a resonant frequency $f_c$ (in Hertz) within the operating frequency range, where the plurality of layers 102 are layered in a z-direction of an orthogonal x-y-z coordinate system, where each layer of the plurality of layers being disposed substantially parallel to an x-y plane, where the plurality of layers has an initial relative magnetic permeability $u_i$ in the x-y plane, and where the plurality of layers has a Snoek's product $u_i$ times $f_c$ that is equal to or greater than $6 \times 10^{11}$ (Hz) and equal to or less than $8 \times 10^{11}$ (Hz), at an Ra surface roughness of at least one of the plurality of layers equal to about 7 nm (surface roughness discussed further below). In an embodiment, the plurality of layers has a Snoek's product $u_i$ times $f_c$ that is equal to or greater than $1.1 \times 10^{12}$ Hz and equal to or less than $1.8 \times 10^{12}$ Hz, at an Ra surface roughness of at least one of the plurality of layers of less than 1 nm.

Each ferromagnetic layer independently has a thickness of greater than or equal to $\frac{1}{15}^{th}$ a skin depth of the respective ferromagnetic material at the defined maximum frequency, and less than or equal to $\frac{1}{5}^{th}$ the skin depth of the respective ferromagnetic material at the defined maximum frequency. Each ferromagnetic layer independently can have the same thickness. The ferromagnetic layer can have a different thickness than another one of the plurality of ferromagnetic layers. A more centrally disposed ferromagnetic layer of the plurality of ferromagnetic layers can be thicker than a more outwardly disposed ferromagnetic layer, where the term "thicker" can mean thicker by a factor of less than or equal to 2:1 and greater than 1:1. For example, in FIG. 1, centrally disposed ferromagnetic layer 306 can be thicker than outermost ferromagnetic layers 302 and 310 and inner ferromagnetic layers 304 and 308 can each independently be the same or different thickness as centrally disposed ferromagnetic layer 306 or outermost ferromagnetic layers 302 and 310. The thickness of the respective ferromagnetic layers can increase from a centrally disposed ferromagnetic layer to an outermost ferromagnetic layer. For example, in FIG. 1, centrally disposed ferromagnetic layer 306 can be thicker than inner ferromagnetic layers 304 and 308; and inner ferromagnetic layers 304 and 308 can be thicker than outermost ferromagnetic layers 302 and 310.

Each ferromagnetic layer independently can comprise the same or different ferromagnetic material. Each ferromagnetic layer can comprise the same ferromagnetic material. The ferromagnetic material of each ferromagnetic layer independently can have a magnetic permeability of greater than or equal to: (the defined maximum frequency in hertz) divided by (800 times $10^9$). The ferromagnetic material can comprise iron, nickel, cobalt, or a combination comprising at least one of the foregoing. The ferromagnetic material can comprise nickel-iron, iron-cobalt, iron-nitride ($Fe_4N$), iron-gadolinium, or a combination comprising at least one of the foregoing. Each ferromagnetic layer independently can have a thickness of greater than or equal to 20 nanometers, or 20 to 60, or 30 to 50 nanometers, or less than or equal to 200 nanometers, or 100 nanometers to 1 micrometer, or 20 nanometers to 1 micrometer. Each ferromagnetic layer independently can comprise iron-nitride and can have a thickness of 100 to 200 nanometers.

Each dielectric layer independently has a thickness and a dielectric constant sufficient to provide a dielectric withstand voltage across the respective thickness of 150 to 1,500 volts peak, the dielectric withstand voltage (also referred to as high potential [Hi-Pot], over potential, or voltage breakdown) being tested in accordance with a standard electrical method such as ASTM D 149, see IPC-TM-650 TEST METHODS MANUAL, Number 2.5.6.1, March 2007. Each dielectric layer can have a dielectric constant of less than or equal to 2.8 at the defined maximum frequency. Each dielectric layer independently can comprise a dielectric polymer and can have a dielectric constant of less than or equal to 2.8 at the defined maximum frequency. Each dielectric layer independently can have a dielectric constant of 2.4 to 5.6, with an intrinsic dielectric strength of 100 to 1,000 volts/micrometer. Each dielectric layer independently can comprise a dielectric polymer and a dielectric filler (e.g., silica) and can have a dielectric constant of 2.4 to 5.6. The dielectric material can have a loss tangent (tan $\delta_e$) of less than or equal to 0.005.

Each dielectric layer independently can have the same thickness. The dielectric layers can have different thickness from one another. Each dielectric layer independently can have a thickness of 0.5 to 6 micrometers. Each dielectric layer independently can have a thickness of 0.1 to 10 micrometers. A ratio of the thickness of any one dielectric layer to any one ferromagnetic layer can be 1:1 to 100:1, or 1:1 to 10:1.

The outermost dielectric layers can have an increased thickness as compared to the dielectric layers within the magneto-dielectric material. For example, the outermost dielectric layers can each independently have a thickness of 20 to 1,000 micrometers, or 50 to 500 micrometers, or 100 to 400 micrometers.

Each dielectric layer independently can comprise the same or different dielectric material. Each dielectric layer independently can comprise the same dielectric material. The plurality of dielectric layers can comprise layers of alternating dielectric material. For example, in FIG. 1, layers 202, 206, and 210 can comprise a first dielectric material and layers 204, 208, and 212 can comprise a second dielectric material (for example, the additional dielectric material or the thin film dielectric material) different from the first dielectric material.

The dielectric material, including the additional dielectric material, the thin film dielectric material, and the outer layer dielectric material, can each independently comprise a dielectric polymer, for example, a thermoplastic polymer or a thermoset polymer. The polymer can include oligomers, polymers, ionomers, dendrimers, copolymers (such as graft copolymers, random copolymers, block copolymers (e.g., star block copolymers, random copolymers, etc.)), and combinations comprising at least one of the foregoing. Examples of thermoplastic polymers that can be used include cyclic olefin polymers (including polynorbornenes and copolymers containing norbornenyl units, for example, copolymers of a cyclic polymer such as norbornene and an acyclic olefin such as ethylene or propylene), fluoropolymers (e.g., polyvinyl fluoride (PVF), polyvinylidene fluoride (PVDF), fluorinated ethylene-propylene (FEP), polytetrafluoroethylene (PTFE), poly(ethylene-tetrafluoroethylene (PETFE), perfluoroalkoxy (PFA)), polyacetals (e.g., polyoxyethylene and polyoxymethylene), poly($C_{1-6}$ alkyl)acrylates, polyacrylamides (including unsubstituted and mono-N- and di-N—($C_{1-8}$ alkyl)acrylamides), polyacrylonitriles, polyamides (e.g., aliphatic polyamides, polyphthalamides, and polyaramides), polyamideimides, polyanhydrides, polyarylene ethers (e.g., polyphenylene ethers), poly(ether ketones) (e.g., polyether ether ketone (PEEK) and polyether ketone ketone (PEKK)), polyarylene ketones, polyarylene sulfides (e.g., polyphenylene sulfides (PPS)), polyarylene sulfones (e.g., polyethersulfones (PES), polyphenylene sulfones (PPS), and the like), polybenzothiazoles, polybenzoxazoles, polybenzimidazoles, polycarbonates (including homopolycarbonates and polycarbonate copolymers such as polycarbonate-esters), polyesters (e.g., polyethylene terephthalates, polybutylene terephthalates, polyarylates, and polyester copolymers such as polyester-ethers), polyetherimides, polyimides, poly ($C_{1-6}$ alkyl)methacrylates, polymethacrylamides (including unsubstituted and mono-N- and di-N—($C_{1-8}$ alkyl)acrylamides), polyolefins (e.g., polyethylenes, such as high density polyethylene (HDPE), low density polyethylene (LDPE), and linear low density polyethylene (LLDPE), polypropylenes, and their halogenated derivatives (such as polytetrafluoroethylenes (PTFE)), and their copolymers, for example, ethylene-alpha-olefin copolymers, polyoxadiazoles, polyoxymethylenes, polyphthalides, polysilazanes, polystyrenes (including copolymers such as acrylonitrile-butadiene-styrene (ABS) and methyl methacrylate-butadiene-styrene (MBS)), polysulfides, polysulfonamides, polysulfonates, polysulfones, polythioesters, polytriazines, polyureas, polyurethanes, vinyl polymers (including polyvinyl alcohols, polyvinyl esters, polyvinyl ethers, polyvinyl halides (e.g., polyvinyl fluoride), polyvinyl ketones, polyvinyl nitriles, polyvinyl thioethers, and polyvinylidene fluorides), alkyds, bismaleimide polymers, bismaleimide triazine polymers, cyanate ester polymers, benzocyclobutene polymers, diallyl phthalate polymers, epoxies, hydroxymethylfuran polymers, melamine-formaldehyde polymers, phenolics (including phenol-formaldehyde polymers such as novolacs and resoles), benzoxazines, polydienes such as polybutadienes (including homopolymers and copolymers thereof, e.g., poly(butadiene-isoprene)), polyisocyanates, polyureas, polyurethanes, triallyl cyanurate polymers, triallyl isocyanurate polymers, and polymerizable prepolymers (e.g., prepolymers having ethylenic unsaturation, such as unsaturated polyesters, polyimides), or the like.

The dielectric material can comprise a polyolefin (such as a polypropylene or polyethylene), and a cyclic olefin copolymer such as a TOPAS* olefin polymer commercially available from TOPAS Advance Polymers, Frankfurt-Hoechst, Germany (where superscript * designates a trademark owned by TOPAS Advance Polymers); a polyester (such as poly(ethylene terephthalate)); a polyetherketone (such as polyether ether ketone); or a combination comprising at least one of the foregoing. The dielectric material can comprise PTFE, expanded PTFE, FEP, PFA, ETFE (polyethylene-tetrafluoroethylene), a fluorinated polyimide, or a combination comprising at least one of the foregoing.

At least one dielectric layer can comprise a fluorinated polyimide with a dielectric constant of 2.4 to 2.6, with a thickness of 0.1 to 4.7 micrometers.

The dielectric material, including the additional dielectric material, the thin film dielectric material, and the outer layer dielectric material, can each independently comprise one or more dielectric fillers to adjust the properties thereof (e.g., dielectric constant or coefficient of thermal expansion). The dielectric filler can comprise titanium dioxide (such as rutile or anatase), barium titanate, strontium titanate, silica (for example, fused amorphous silica or fumed silica), corundum, wollastonite, boron nitride, hollow glass microspheres, or a combination comprising at least one of the foregoing.

The dielectric material, including the additional dielectric material, the thin film dielectric material, and the outer layer dielectric material, can each independently comprise a ceramic. For example, use of a ceramic in place of a polymer could be in accordance with the following: the thickness of the ceramic relative to the thickness of a suitable polymer in accordance with an embodiment disclosed herein would be adjusted such that the ratio (given ceramic dielectric constant)/(suitable polymer dielectric constant) is equal to the ratio (suitable polymer thickness)/(given ceramic thickness). The ceramic can comprise silicon dioxide ($SiO_2$), alumina, aluminum nitride, silicon nitride, or a combination comprising at least one of the foregoing. The thickness of the ceramic layer, for example, comprising silicon dioxide, can be less than or equal to [$2.1/(\varepsilon_r$ of the ceramic)×(8 micrometers)], and can have a minimum dielectric strength of 150 volts peak.

Each dielectric layer can comprise two or more dielectric materials that are different from each other. For example, a given dielectric layer can comprise a first dielectric material and a second dielectric material, each with different dielectric constants and either the same thickness or different thicknesses. The first dielectric material can comprise a fluorinated polyimide and the second dielectric material can comprise PTFE or expanded PTFE, PEEK, or PFA. The first dielectric material can comprise a ceramic and the second dielectric material is either a ceramic or a non-ceramic dielectric material. The first dielectric material can provide a substrate for deposition thereon of one of the plurality of the ferromagnetic material layers, and the second dielectric material can provide an additional dielectric layer for control of the substrate refractive index. The first dielectric material and the second dielectric material can be separated by a ferromagnetic layer. The plurality of dielectric layers can comprise alternating layers of a first dielectric material layer and a second dielectric material layer wherein each of the first dielectric material layer and the second dielectric material layer are separated by a ferromagnetic layer.

A conductive layer can be located on one or both of the uppermost dielectric layer and the lowermost dielectric layer. The conductive layer can comprise copper. The conductive layer can have a thickness of 3 to 200 micrometers, specifically, 9 to 180 micrometers. Suitable conductive layers include a thin layer of a conductive metal such as a copper foil presently used in the formation of circuits, for example, electrodeposited copper foils. The copper foil can have a root mean squared (RMS) surface roughness of less than or equal to 2 micrometers, specifically, less than or equal to 0.7 micrometers, where roughness is measured using a Veeco Instruments WYCO Optical Profiler, using the method of white light interferometry.

It is known in the art that surface roughness may be described in terms of RMS or Ra values, where Ra is an arithmetic average of absolute values of surface profile height deviations with respect to a mean line within an evaluation length according to measurement standard ASME B46.1, and RMS is the root mean square average of the surface profile height deviations with respect to a mean line within an evaluation length according to measurement standard ASME B46.1. As such, embodiments of the invention may be described with reference to either RMS or Ra values, and the scope of the invention is not limited to usage of just one or the other but encompasses both RMS and Ra values consistent with the disclosure herein.

Regarding the plurality of dielectric material layers 200, at least one side of at least one layer of the plurality of dielectric material layers 200 has an average surface RMS roughness value equal to or less than a defined maximum RMS value, wherein the defined maximum RMS value is equal to or less than 60 nanometers. In an embodiment, the defined maximum RMS value is 20 nanometers. In another embodiment, the defined maximum RMS value is 10 nanometers. In an embodiment, each side of the at least one layer of the plurality of dielectric material layers 200 has an RMS value equal to or less than the defined maximum RMS value. In an embodiment, at least one side of each layer of the plurality of dielectric material layers 200 has an RMS value equal to or less than the defined maximum RMS value. In an embodiment, each side of each layer of the plurality of dielectric material layers 200 has an RMS value equal to or less than the defined maximum RMS value.

In an embodiment, the defined maximum RMS value is the root mean square average of the surface profile height deviations with respect to a mean line within an evaluation length according to measurement standard ASME B46.1.

However, in an embodiment the defined maximum surface roughness value may be a defined maximum Ra value that is an arithmetic average of absolute values of surface profile height deviations with respect to a mean line within an evaluation length according to measurement standard ASME B46.1.

In an embodiment, the defined maximum RMS value, or Ra value, is determined by measurement in multiple linear directions, parallel to each other or not, over an entire surface area of the respective side of the respective layer of the plurality of dielectric material layers 200.

In an embodiment, at least one interface between adjacent ones of the plurality of dielectric material layers 200 and the plurality of ferromagnetic material layers 300 has an average interface roughness RMS value equal to or less than a defined maximum RMS value, wherein, as noted herein above, the defined maximum RMS value may be equal to or less than 60 nanometers, or may be 20 nanometers, or may be 10 nanometers. In an embodiment, the ferromagnetic material surface roughness is very close to the dielectric material surface roughness due to the thin thickness of the ferromagnetic film.

In an embodiment, each respective interface between adjacent ones of the plurality of dielectric material layers 200 and the plurality of ferromagnetic material layers 300 has an average interface roughness RMS value equal to or less than the defined maximum RMS value.

In an embodiment, the defined maximum RMS value is the root mean square average of interface profile height deviations with respect to a mean line within an evaluation length according to measurement standard ASME B46.1.

However, in an embodiment the defined maximum surface roughness value may be a defined maximum Ra value that is an arithmetic average of absolute values of interface profile height deviations with respect to a mean line within an evaluation length according to measurement standard ASME B46.1.

In an embodiment, the defined maximum RMS value, or Ra value, is determined by measurement in multiple linear directions, parallel to each other or not, over an entire respective interface area of the respective adjacent ones of the plurality of dielectric material layers and the plurality of ferromagnetic material layers.

Example embodiments of thin Iron Nitride samples (60 nm-150 nm thickness) were prepared on Polyimide (PI) for permeability measurement, resulting in substantial relative permeability values of 150-500 and a measured surface roughness Ra value of about 6.5 nm (approximately 9 nm RMS), which is deemed suitable for a multi-layer magneto-dielectric material 100 as herein disclosed. In an embodiment, the surface roughness measurement was done by AFM (Atomic Force Microscopy) in a small area, such as 40×40 micron for example, but the area may be changed as desired, with usually a maximum area of 100×100 micron being used.

Notwithstanding the foregoing, experimentation has found that the Snoek product and permeability of coated magnetic film is related to surface roughness of the associated dielectrics, and considering the desired limit of thickness of magnetic film useful for a purpose disclosed herein, a surface RMS roughness of 20 nm or greater has been found to have a undesirable effect on the magnetic performance of the magneto-dielectric material 100.

An apparatus can comprise the magneto-dielectric material 100. An example application for the apparatus is for use in a dipole antenna where the magneto-dielectric material is used to form a magneto-dielectric cavity loading element that enables the antenna to be placed dramatically less than ¼ wavelength, in free space, from a metallic ground plane with little to no degradation in bandwidth. Such applications may include systems where low profile antennas may be needed, or where multiple antenna elements must be co-located in an environment demanding of a small form factor antenna.

Figure 2:
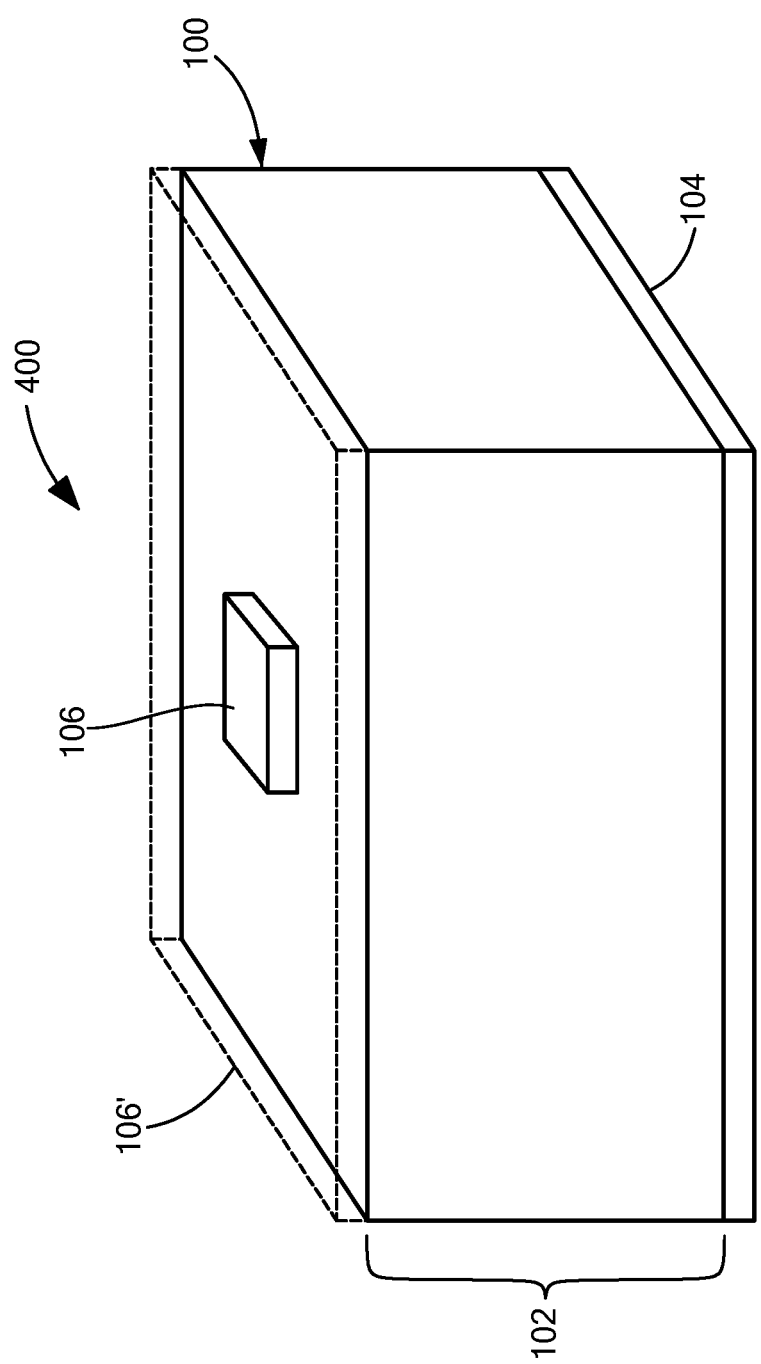
FIG. 2 depicts an illustrative perspective view of an embodiment of an apparatus comprising the magneto-dielectric material of FIG. 1, in accordance with an embodiment.

With reference now to FIG. 2, an example apparatus 400 for use with the magneto-dielectric material 100 is depicted having a first conductive layer 104 disposed in conforming direct contact with the lowermost dielectric layer of the plurality of layers 102, and a second conductive layer 106 disposed in conforming direct contact with the uppermost dielectric layer of the plurality of layers 102. The first conductive layer 104 can define a ground plane and the second conductive layer 106 can define a patch suitable for use in a patch antenna. The first and second conductive layers 104, 106 can be copper cladded layers. The apparatus 400 can be in the form of a multilayer sheet where each of the plurality of layers 102 and the first and second conductive layers 104, 106' (depicted in dotted line fashion) have the same plane view dimensions. While FIG. 2 depicts apparatus 400, such as a single patch antenna, it will be appreciated that the scope of the disclosure is not so limited and also encompasses a plurality of apparatuses (such as a plurality of patch antennas) arranged in an array to form a multi-layer magneto-dielectric thin film antenna array.

As used herein the term conforming direct contact means that each layer of the herein described layers is in direct contact with its respective adjacent layer or layers and conforms to the respective surface profile or profiles of the respective adjacent layer or layers so as to form a magneto-dielectric material that is substantially absent any voids at an interface between a pair of adjacent layers.

In general, the disclosure can alternately comprise, consist of, or consist essentially of, any appropriate components herein disclosed. The disclosure can additionally, or alternatively, be formulated so as to be devoid, or substantially free, of any components, materials, ingredients, adjuvants or species used in the prior art compositions or that are otherwise not necessary to the achievement of the function and/or objectives of the present disclosure.

The terms "a" and "an" do not denote a limitation of quantity, but rather denote the presence of at least one of the referenced item. The term "or" means "and/or" unless clearly indicated otherwise by context. "Optional" or "optionally" means that the subsequently described event or circumstance may or may not occur, and that the description includes instances where the event occurs and instances where it does not.

Reference throughout the specification to "an embodiment", "another embodiment", "some embodiments", and so forth, means that a particular element (e.g., feature, structure, step, or characteristic) described in connection with the embodiment is included in at least one embodiment described herein, and may or may not be present in other embodiments. In addition, it is to be understood that the described elements may be combined in any suitable manner in the various embodiments.

In general, the compositions, methods, and articles can alternatively comprise, consist of, or consist essentially of, any ingredients, steps, or components herein disclosed. The compositions, methods, and articles can additionally, or alternatively, be formulated, conducted, or manufactured so as to be devoid, or substantially free, of any ingredients, steps, or components not necessary to the achievement of the function or objectives of the present claims.

Unless specified to the contrary herein, all test standards are the most recent standard in effect as of the filing date of this application, or, if priority is claimed, the filing date of the earliest priority application in which the test standard appears.

The endpoints of all ranges directed to the same component or property are inclusive of the endpoints, are independently combinable, and include all intermediate points and ranges.

The terms "first," "second," and the like, "primary," "secondary," and the like, as used herein do not denote any order, quantity, or importance, but rather are used to distinguish one element from another. The terms "upper", "lower", "bottom", and/or "top" are used herein, unless otherwise noted, merely for convenience of description, and are not limited to any one position or spatial orientation. The term "combination" is inclusive of blends, mixtures, alloys, reaction products, and the like.

Unless defined otherwise, technical and scientific terms used herein have the same meaning as is commonly understood by one of skill in the art to which this disclosure belongs.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A magneto-dielectric material operable over an operating frequency range equal to or greater than a defined minimum frequency and equal to or less than a defined maximum frequency, the magneto-dielectric material comprising:
a plurality of layers in conforming direct contact with respective adjacent layers that alternate between a film of dielectric material and a film of ferromagnetic material forming a plurality of dielectric material layers in alternating arrangement with a plurality of ferromagnetic material layers, a lowermost layer and an uppermost layer of the plurality of layers each being a dielectric material;
each layer of the plurality of ferromagnetic material layers having a thickness equal to or greater than 1/15th a skin depth of the respective ferromagnetic material at the defined maximum frequency, and equal to or less than 1/5th the skin depth of the respective ferromagnetic material at the defined maximum frequency;
wherein the ferromagnetic material of each layer of the plurality of ferromagnetic material layers comprises a film of iron-nitride with continuous x-y plane permeability;
wherein the ferromagnetic material of each layer of the plurality of ferromagnetic material layers has a relative permeability of equal to or greater than 150 and equal to or less than 500;
each layer of the plurality of dielectric material layers having a thickness and a dielectric constant that provides a dielectric withstand voltage across the respective thickness of equal to or greater than 150 Volts peak and equal to or less than 1,500 Volts peak;
each layer of the plurality of dielectric material layers having a thickness greater than 0.1 micrometers and equal to or less than 10 micrometers: and
the plurality of layers having an overall thickness equal to or less than one wavelength of the defined minimum frequency in the plurality of layers.

2. The magneto-dielectric material of claim 1, wherein:
at least one side of at least one layer of the plurality of dielectric material layers has an average surface roughness RMS value equal to or less than a defined maximum RMS value, wherein the defined maximum RMS value is equal to or less than 60 nanometers.

3. The magneto-dielectric material of claim 2, wherein the defined maximum RMS value is 20 nanometers.

4. The magneto-dielectric material of claim 2, wherein the defined maximum RMS value is 10 nanometers.

5. The magneto-dielectric material of claim 2, wherein:
each side of the at least one layer of the plurality of dielectric material layers has an RMS value equal to or less than the defined maximum RMS value.

6. The magneto-dielectric material of claim 2, wherein:
at least one side of each layer of the plurality of dielectric material layers has an RMS value equal to or less than the defined maximum RMS value.

7. The magneto-dielectric material of claim 2, wherein:
each side of each layer of the plurality of dielectric material layers has an RMS value equal to or less than the defined maximum RMS value.

8. The magneto-dielectric material of claim 2 wherein the defined maximum RMS value is the root mean square average of the surface profile height deviations with respect to a mean line within an evaluation length according to measurement standard ASME B46.1.

9. The magneto-dielectric material of claim 2 wherein the defined maximum RMS value is determined by measurement in multiple linear directions over an entire surface area of the respective side of the respective layer of the plurality of dielectric material layers.

10. The magneto-dielectric material of claim 1, wherein at least one interface between adjacent ones of the plurality of dielectric material layers and the plurality of ferromagnetic material layers has an average interface roughness RMS value equal to or less than a defined maximum RMS value, wherein the defined maximum RMS value is equal to or less than 60 nanometers.

11. The magneto-dielectric material of claim 10, wherein the defined maximum RMS value is 20 nanometers.

12. The magneto-dielectric material of claim 10, wherein the defined maximum RMS value is 10 nanometers.

13. The magneto-dielectric material of claim 10, wherein each respective interface between adjacent ones of the plurality of dielectric material layers and the plurality of ferromagnetic material layers has an average interface roughness RMS value equal to or less than the defined maximum RMS value.

14. The magneto-dielectric material of claim 10 wherein the defined maximum RMS value is the root mean square average of the surface profile height deviations with respect to a mean line within an evaluation length according to measurement standard ASME B46.1.

15. The magneto-dielectric material of claim 10 wherein the defined maximum RMS value is determined by measurement in multiple linear directions over an entire respective interface area of the respective adjacent ones of the plurality of dielectric material layers and the plurality of ferromagnetic material layers.

16. The magneto-dielectric material of claim 1 operable at a resonant frequency fc, in Hertz (Hz), within the operating frequency range, wherein:
the plurality of layers are layered in a z-direction of an orthogonal x-y-z coordinate system, each layer of the plurality of layers being disposed substantially parallel to an x-y plane;
the plurality of layers has an initial relative magnetic permeability ui in the x-y plane; and
the plurality of layers has a Snoek's product ui times fc that is equal to or greater than $6 \times 10^{11}$ Hz and equal to or less than $8 \times 10^{11}$ Hz at an Ra surface roughness of at least one of the plurality of layers equal to about 7 nm.

17. The magneto-dielectric material of claim 1 operable at a resonant frequency fc, in Hertz (Hz), within the operating frequency range, wherein:
the plurality of layers are layered in a z-direction of an orthogonal x-y-z coordinate system, each layer of the plurality of layers being disposed substantially parallel to an x-y plane;
the plurality of layers has an initial relative magnetic permeability ui in the x-y plane; and
the plurality of layers has a Snoek's product ui times fc that is equal to or greater than $1.1 \times 10^{12}$ Hz and equal to or less than $1.8 \times 10^{12}$ Hz at an Ra surface roughness of at least one of the plurality of layers of less than 1 nm.

18. The magneto-dielectric material of claim 1, wherein the plurality of layers are arranged parallel with an x-y plane in an orthogonal x-y-z coordinate system, the overall thickness of the plurality of layers is in the z-direction, and the wavelength in the plurality of layers is given by:

$$\lambda = c/[f * \text{sqrt}(\varepsilon 0 * \varepsilon r * \mu 0 * \mu r)];$$

where:
c is the speed of light in a vacuum in meters/second;
f is the defined minimum frequency in Hertz;
$\varepsilon 0$ is the permittivity of a vacuum in Farads/meter;
$\varepsilon r$ is the relative permittivity of the plurality of layers in the z-direction;
$\mu 0$ is the permeability of a vacuum in Henrys/meter; and
$\mu r$ is the relative permeability of the plurality of layers in the x-y plane.

19. The magneto-dielectric material of claim 1, wherein:
each layer of the plurality of ferromagnetic material layers has a thickness equal to or greater than 100 nanometers and equal to or less than 200 nanometers.

\* \* \* \* \*